United States Patent
Grebner et al.

(10) Patent No.: US 6,882,139 B2
(45) Date of Patent: Apr. 19, 2005

(54) ELECTRONIC COMPONENT, TESTER DEVICE AND METHOD FOR CALIBRATING A TESTER DEVICE

(75) Inventors: Thomas Grebner, Freising (DE); Erwin Thalmann, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/186,644

(22) Filed: Jul. 1, 2002

(65) Prior Publication Data

US 2003/0020488 A1 Jan. 30, 2003

(30) Foreign Application Priority Data

Jun. 29, 2001 (DE) .......................................... 101 31 712

(51) Int. Cl.[7] .......................... G01R 1/04; G01R 31/02
(52) U.S. Cl. ..................................... 324/158.1; 324/763
(58) Field of Search ..................... 324/158.1, 763–765; 702/85–99

(56) References Cited

U.S. PATENT DOCUMENTS

| 5,495,100 | A | * | 2/1996 | Takeshima | 324/96 |
|---|---|---|---|---|---|
| 5,578,932 | A | * | 11/1996 | Adamian | 324/73.1 |
| 5,589,765 | A | * | 12/1996 | Ohmart et al. | 324/158.1 |
| 5,703,489 | A | | 12/1997 | Kuroe | |
| 5,794,175 | A | * | 8/1998 | Conner | 324/158.1 |
| 6,130,565 | A | * | 10/2000 | Nagano et al. | 327/157 |
| 6,366,225 | B1 | * | 4/2002 | Ozdemir | 341/111 |
| 6,417,674 | B1 | * | 7/2002 | Rowell et al. | 324/601 |
| 6,417,682 | B1 | * | 7/2002 | Suzuki et al. | 324/755 |
| 6,507,185 | B1 | * | 1/2003 | Hennekes et al. | 324/158.1 |
| 6,590,427 | B1 | * | 7/2003 | Murphy et al. | 327/112 |
| 2003/0076126 | A1 | * | 4/2003 | Grebner et al. | 324/765 |

FOREIGN PATENT DOCUMENTS

DE 10141025 A1 * 8/2001 ........... G01R/31/28

OTHER PUBLICATIONS

Feldman, R.: "A Novel Instrument for Accurate Time Measurement in Automatic Calibration of Test Systems", IEEE, 1993, pp. 544–551.

* cited by examiner

Primary Examiner—David Zarneke
Assistant Examiner—Jermele Hollington
(74) Attorney, Agent, or Firm—Laurence A. Greenberg; Werner H. Stemer; Gregory L. Mayback

(57) ABSTRACT

An electronic calibration component for calibrating a tester device is described. The calibration component has a signal input, to which a tester channel to be calibrated can be connected, and a phase difference circuit. The phase difference circuit can be connected to the signal input and can be connected to a reference clock signal. As a result, a phase difference information item is determined between a cyclic signal applied to the signal input and the reference clock signal. The electronic calibration component also has an output device in order to output the phase difference information item. The latter is received by a tester device that can be connected to the calibration component via tester channels. The tester device has a delay device that is connected to the tester channel in order to delay signals to be transmitted on the tester channel on the basis of the phase difference information item.

22 Claims, 1 Drawing Sheet

ELECTRONIC COMPONENT, TESTER DEVICE AND METHOD FOR CALIBRATING A TESTER DEVICE

BACKGROUND OF THE INVENTION

FIELD OF THE INVENTION

The invention relates to a tester device, an electronic component and a method for calibrating a tester device.

Normally, there is a need with automatic tester devices to calibrate the levels and timing of the test signals generated by the tester device. The signal delay times of the signals required for testing a component regularly differ from one another substantially on account of configuration differences within the tester device and on account of different signal paths from the output stage of the tester device to the component which is to be tested. Thus, by way of example, differing cable lengths in the "Hi Fix", the link between a test head and a component support, result in delay time differences. In addition, the signal delay times for the signals leaving the component that is to be tested back into the tester device also need to be considered.

The discrepancies are in a time range whose order of magnitude is in the region of the period duration of the operating cycle of the components to be tested. It is therefore a matter of urgent necessity that the tester device be calibrated in order to test the components correctly. To this end, the tester device normally has built-in variable delay elements that can be set in order to compensate for the different signal delay times. The delay elements are set in accordance with calibration methods that have been made available. Since the calibration is lost through diverse influences (temperature, swapping of tester parts, etc.), it needs to be repeated again and again at particular intervals and therefore represents a requirement in terms of personnel, time and cost.

By way of example, the tester manufacturer ADVANTEST provides two calibration methods, AUTO-CAL and HICAL. The AUTOCAL method has the drawback that its calibration procedure does not include the signal path from the tester output stage through the Hi Fix to the support for the component that is to be tested. This is a considerable drawback particularly if new memory product generations having relatively high speed requirements need to be tested on older tester systems.

The HICAL calibration method takes into account the signal delay time differences via the signal path. It thus admittedly permits a very good calibration result, but is not suitable as a routine calibration method, since an additional device is required. The additional device respectively needs to be incorporated into the tester device, which results in that the regular test operation is interrupted. In addition, a "calibration robot" needs to be mounted on the test head. This method is very time-consuming and is not automatic, since fitting and control need to be effected by a user.

SUMMARY OF THE INVENTION

It is accordingly an object of the invention to provide an electronic component, a tester device and a method for calibrating a tester device that overcome the above-mentioned disadvantages of the prior art methods and devices of this general type, which provides simple, accurate and time-saving calibration of the tester device.

With the foregoing and other objects in view there is provided, in accordance with the invention, an electronic calibration component for calibrating a tester device. The electronic calibration component contains a signal input that can be connected to the tester device using a supply line, a phase difference circuit coupled to the signal input and receives a reference clock signal to determine a phase difference information item between a cyclic calibration signal applied to the signal input and the reference clock signal, and an output device for outputting the phase difference information item to the tester device. The output device is coupled to the phase difference circuit.

In accordance with a first aspect of the present invention, the electronic calibration component for calibrating a tester device is provided. The electronic calibration component has a signal input that can be connected to the tester device using a supply line. There is also a phase difference circuit that can be connected to the signal input and is connected to a reference clock signal. The phase difference circuit ascertains a phase difference information item between a cyclic calibration signal applied to the signal input and the reference clock signal. The electronic calibration component also has an output device in order to output the phase difference information item to the tester device.

In accordance with another aspect of the present invention, a tester apparatus is provided which can be used to operate a test procedure for an electronic component in accordance with the invention. The tester apparatus has a tester channel to which a cyclic calibration signal can be applied. The tester channel can be connected to the electronic component. The tester apparatus has a reception device in order to determine the phase difference information item for the phase difference between the cyclic calibration signal and the reference clock signal. The tester apparatus has a delay device that is connected to the tester channel in order to delay signals that are to be transmitted on the tester channel on the basis of the phase difference information item.

In the regular production mode, the tester device tests electronic components in succession or in batches containing a particular number of components.

The inventive electronic calibration component is incorporated into the existing test cycle, as a result of which the tester device is calibrated fully automatically. To this end, the electronic calibration component is inserted, by way of example, into a batch of components that are to be tested, so that calibration is performed as soon as the tester device is connected to the inventive calibration component via one of the tester channels. In this way, the tester device can be calibrated at any desired times and as often as can be selected by the number of calibration components used, during testing of components which are to be tested. It is even possible to insert a plurality of calibration components into a batch. This is a particularly simple matter particularly if the type of configuration of the inventive calibration component corresponds to the type of configuration of the components that are to be tested, which results in that the calibration component can be disposed at any position, provided for a component to be tested, on a component carrier.

The inventive electronic calibration component measures a phase difference between a cyclic calibration signal applied to a signal input and a reference clock signal. The phase shift between the two signals can be regarded as a measure of the signal delay time from the tester device to the electronic component.

So that the tester device sets the delay device in accordance with the phase shift determined, the electronic calibration component needs to output a phase difference information item to the tester device. This allows the tester device to match the setting in the delay device to the signal delay time.

One advantage of the inventive electronic calibration component is that a continuous test procedure is made possible in which the inventive calibration component is added to a number of components to be tested which are supplied to a tester device continuously in succession or in batches for the purpose of parallel testing. As soon as the tester device identifies a connected electronic calibration component, calibration is performed. This saves time and no action by a user is required.

Another advantage of the invention is that the calibration component measures of the signal delay times very exactly by measuring a phase difference between a signal sent by a tester device to the electronic component via the supply line and a reference signal. Since manual operation of the tester device for calibration is no longer necessary, the conditions under which calibration takes place are very similar to the conditions under which the components to be tested are tested.

In accordance with an added feature of the invention, the output device is configured to output the phase difference information item through the signal input.

Provision can be made for the electronic calibration component to have a reference clock signal generating device which generates the reference clock signal for which the phase difference with respect to the calibration signal is ascertained. The phase of the difference clock signal then needs to be determined exactly or matched to the cyclic signals applied to the signal input, however, before calibration starts, in order to obtain an absolute phase difference information item. However, it is particularly advantageous if the tester device connected to the electronic calibration component makes the reference clock signal available to the calibration component via a reference clock signal input. In this way, the tester device determines the temporal relationship between the phases of the reference clock signal and the cyclic signal.

Preferably, the calibration component has a data store in order to store the phase difference information item. This is particularly useful if a plurality of tester channels are connected to the calibration component, with a phase difference information item first being ascertained and stored for each tester channel before the information items are transmitted to a tester device.

Provision can also be made for the calibration component to have a reference signal switching device in order to connect the signal input to the reference clock signal input. This makes it possible to determine the skew between the signal paths on which test signals pass from the component to be tested to the tester device during the subsequent component test. The tester device can determine, for each tester channel, the discrepancy from the nominal value with regard to the arrival of the signal edge of the reference clock received via the signal input and can align the respective delay devices accordingly.

To calibrate a plurality of tester channels, the calibration component has a plurality of signal inputs that are respectively connected to a phase difference circuit. The phase difference can thus be measured simultaneously on a plurality of tester channels, which allows calibration time to be saved. As a further option, the plurality of tester channels can be calibrated by using a switching apparatus to connect each of the tester channels to the phase difference circuit in order to ascertain the phase difference information item. The phase difference information item for each tester channel is then preferably stored in the data store until all the phase difference information items have been ascertained. The second option has the advantage that the electronic calibration circuit needing to be provided on the calibration component can be kept simple, so that substrate area can be saved in the case of an integrated configuration.

To match the input response of the calibration component to the component which is to be tested, tuning devices can be provided at the signal inputs, as a result of which the impedance, switching delay or the like can be matched to the corresponding parameters of the component which is to be tested. Such a tuning device can contain a delay element, a capacitance component or something else.

The phase difference information item can contain an information item indicating the magnitude and arithmetic sign of the phase difference, which is transmitted to the tester device serially via one signal input or in parallel via a plurality of signal inputs. In the tester device, the corresponding delay devices are set on the basis of the transmitted phase difference information item. However, provision can also be made for just the arithmetic sign of the phase difference to be transmitted as the phase difference information item, so that incremental alignment of the delay device in the tester device allows the delay device to set the time delay iteratively. This is done by increasing or reducing the delay in the delay device by a particular magnitude until it has the desired delay.

The calibration component in accordance with the invention preferably has a control unit in order to operate the electronic component in a first mode or a second mode. The first mode has provision for data to be received and/or transmitted via the tester channel, such as the phase difference information item. The second mode has provision for the calibration signal to be applied via the tester channel and via the signal input and for the phase difference to be determined. In this mode, no data are transmitted, but rather merely calibration signals are applied. This is advantageous because all the tester channels need to be accessible for calibration, so that the respective calibration signal is intermittently applied to each of the signal inputs of the calibration component, or sometimes even to the reference clock signal input. If the calibration signal is present on a tester channel, then no data can be transmitted via this tester channel. A changeover between the first mode and the second mode is affected using the control device. If the control device receives a request from the tester device to start calibration now, the phase difference measurement is performed for a predetermined length of time by applying cyclic calibration signals to all the tester channels before data can be transmitted from and to the tester.

The inventive tester apparatus is able to obtain an external phase difference information item and to set the delay device on the tester channel accordingly. Such a tester apparatus has the advantage that it does not have to determine the signal delay time for a tester channel itself, in which case it would not be possible to take into account signal delays which are caused in the component to be tested.

The tester device can be provided such that it uses a further tester channel to transmit a reference clock signal. This facilitates using the phase difference information item to ascertain the exact time delay that needs to be set in the delay device. This is because in this case it is possible to dispense with stipulating a phase for a reference clock signal generated in the calibration component before the start of calibration.

The invention can also make provision for the tester device to have a phase difference circuit in order to determine a further phase difference between a signal received on the tester channel and the reference clock signal applied to the further tester channel. In this way, the tester device can also minimize the skew between the signal paths on which signals pass from the component to be tested to the tester device during the subsequent component test. A calibration program executed in the tester apparatus can be used to determine the discrepancy from the nominal value for the arrival of the signal edge of the reference clock signal passing via the calibration component, and the corresponding delay device can then be aligned.

So that it is possible to identify the electronic component provided for calibration, the tester device is provided such that it transmits a request signal, whereupon the calibration component outputs an identification signal, which allows the calibration method to be started. Components to be tested will then not respond to the request signal or will respond in different ways, so that the tester apparatus can start the test procedure for the electronic components that are to be tested.

With the foregoing and other objects in view there is provided, in accordance with the invention, a method for calibrating a tester device having a tester channel for testing functional components. The method includes making available a cyclic calibration signal on the tester channel, making available a reference clock signal, determining a phase difference information item from a phase difference between the reference clock signal and the cyclic calibration signal, and setting a signal delay for the tester channel such that the cyclic calibration signal is delayed on a basis of the phase difference information item.

In accordance with an added mode of the invention, there is the step of making available the reference clock signal on a further tester channel.

In accordance with a further mode of the invention, there is the step of transmitting via the tester device an identification information item via the tester channel or the further tester channel before a start of testing of a functional component. The testing is started if a response to the identification information item indicates that the electronic calibration component is connected to the tester channel.

Other features which are considered as characteristic for the invention are set forth in the appended claims.

Although the invention is illustrated and described herein as embodied in an electronic component, a tester device and a method for calibrating a tester device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
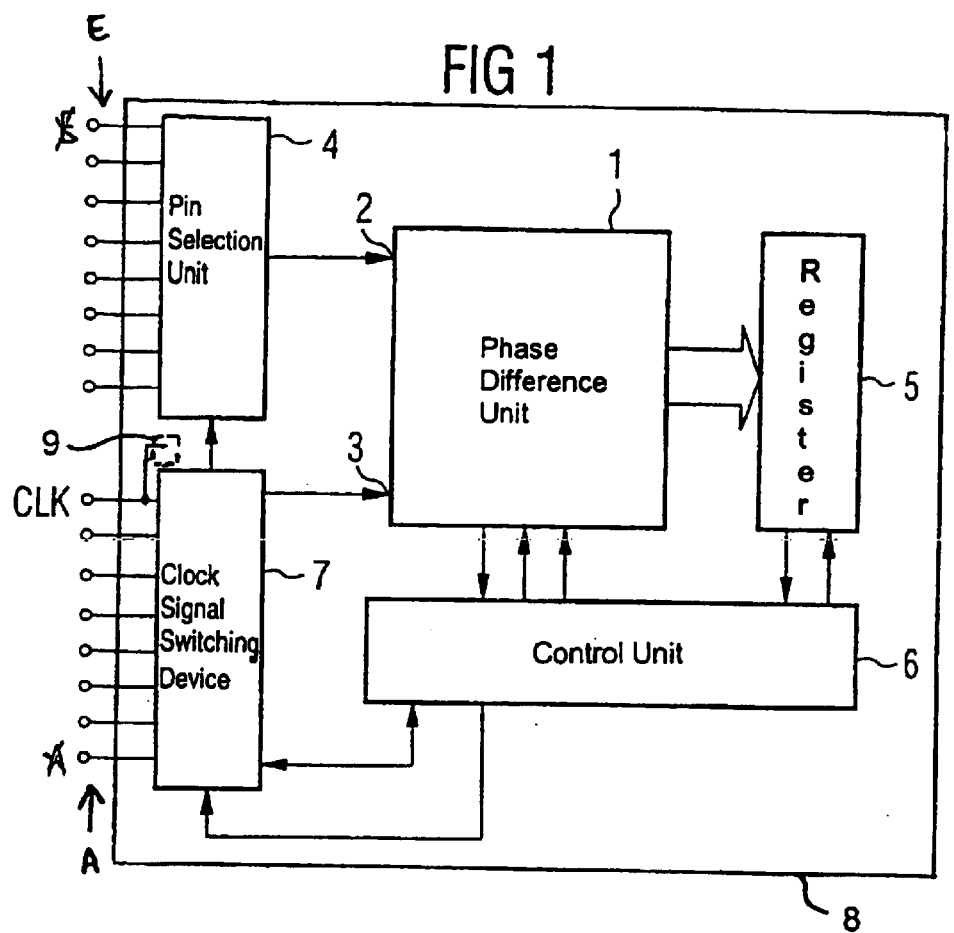
FIG. 1 is a block diagram of a calibration component in accordance with one embodiment of the invention.

Referring now to the figures of the drawing in detail and first, particularly, to FIG. 1 thereof, there is shown a block diagram of a calibration component in accordance with one embodiment of the invention. Such a calibration component is provided in order to calibrate a tester device intended to test particular components. Calibration needs to be made as easy as possible, which is achieved by inserting the calibration component among the components that are to be tested. Whenever a calibration component is connected to the tester device in the course of the test procedure, a calibration procedure is performed. This makes it possible to carry out calibration of the tester device without interrupting a continuous test cycle.

To this end, an external configuration of the calibration component is matched to that of the components to be tested. The calibration component has the same type of configuration as the components that are to be tested, this likewise includes the pin assignment of the components that are to be tested. That is to say the pin positions of the component to be tested that are used as signal inputs are used for calibrating arriving signals, and the output pins are used for testing output signals.

The inventive calibration component has a phase difference unit 1 and a control unit 6 as fundamental parts. A first input 2 of the phase difference unit 1 is used to apply, via a pin selection circuit 4, an input signal received via a tester channel E that is to be tested. A second input 3 of the phase difference unit 1 has a reference clock signal applied to it which is received from a connected tester device via a clock input pin CLK of the calibration component (see FIG. 2).

The phase difference unit 1 can be configured such that it quantifies a phase difference and provides it as a numerical value, or it can be a circuit which merely specifies whether the respectively applied calibration signal leads or lags the reference clock signal. The corresponding measured value for the phase difference is stored in a phase difference register provided for this purpose.

The phase difference register 5 preferably has a number of storage locations that corresponds to the number of tester channels E to be tested. The phase difference register 5 can be read by the control unit 6.

The PIN selection circuit 4 is controlled by the control unit 6 such that each tester channel E to be tested is successively applied to the phase difference unit 1, and the phase difference of the latter with respect to the reference clock signal is determined.

Figure 2:
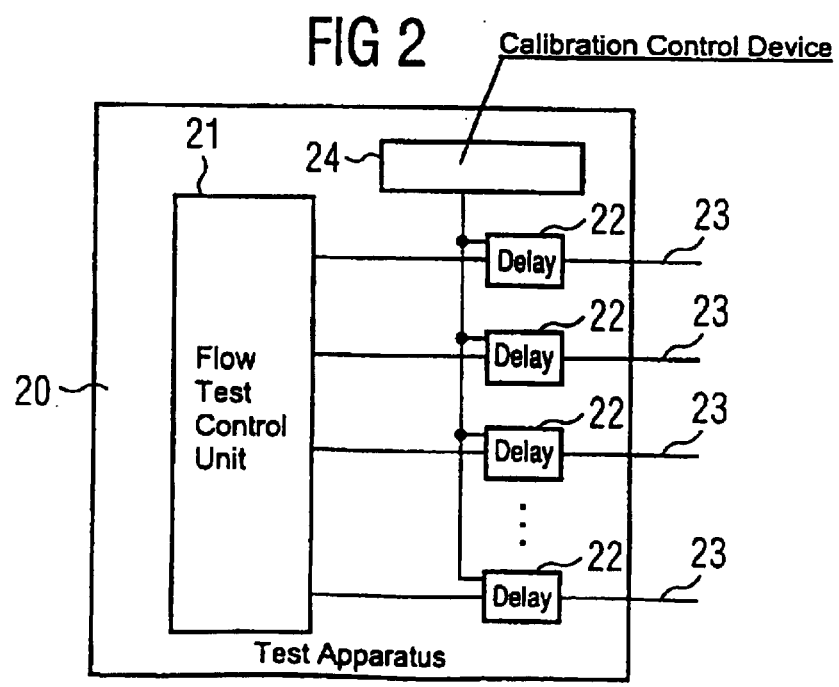
FIG. 2 is a block diagram of a tester device in accordance with a preferred embodiment of the invention.

When all the phase difference values for all the signal inputs have been determined, they are sent to the connected tester device, likewise under the control of the control unit 6 (see FIG. 2).

If the phase difference unit 2 does not ascertain a numerical value but rather merely whether the calibration signal leads or lags the reference clock signal, then the procedure described above is repeated a number of times, and in this way the corresponding delay devices in the tester apparatus are set iteratively.

In this way, all the systematic time discrepancies between signal paths on which signals pass from the tester apparatus to the component to be tested during the subsequent component test can be minimized.

A second property of the calibration component allows the tester device to minimize the systematic time discrepancy between signal paths on which signals are transmitted from the component to be tested to the tester device during the subsequent component test. To this end, provision is made for the control unit 6 to connect in series every relevant signal output A of the calibration component to the reference clock signal CLK.

This is done using a reference clock signal switching device 7. The reference clock signal switching device 7 is connected to the control unit 6, as a result of which it is controlled. Under the control of the control unit 6, the reference clock signal switching device 7 applies the reference clock signal to the signal outputs A. The tester device can then determine the discrepancy from the nominal value for the arrival of the signal edge of the connected reference clock signal and can align a corresponding delay device in the tester apparatus as appropriate.

The tester device has a delay element for each tester channel. The delay element can be set variably, so that it delays a signal that is output onto the tester channel according to a settable value. When the tester device has received the corresponding delay value for each signal input E, the delay devices are set as appropriate.

To be used during testing, the calibration component should have the same type of configuration as the components which are to be tested, i.e. the same housing 8 or the same pin assignment. The calibration component can then be inserted into corresponding component mounts or the like, and can have contact made with it, in the same way as the components which are to be tested. It is likewise possible in this case for the same calibration components to be able to be used for various components to be tested which have the same type of configuration. Therefore, to calibrate the tester device, only one type of calibration component is ever required for different types of configurations when testing components, which results in that new calibration components do not have to be developed for each component type of the same type of configuration.

An embodiment of a possible tester apparatus 20 is shown in FIG. 2. The tester apparatus 20 has a test flow control unit 21 that controls the procedure of testing a component that is to be tested. Inputs and outputs of the test flow control unit 21 are connected to tester channels 23 via delay devices 22. In addition, a calibration control device 24 is provided which is likewise connected to the tester channels 23 via a delay device 22.

When calibration is to be carried out, the test procedure is interrupted by the test flow control unit 21, and the calibration control unit 24 undertakes calibration of the tester channels 23. After the calibration procedure, control of the test procedure is handed back to the test flow control unit 21.

So that the tester device can establish whether a component to be tested or the calibration component is connected to the tester channels 23, provision is made for a predetermined request signal first to be transmitted via one or more of the tester channels 23 after a new component to be tested or a calibration component has been connected to the tester channels 23. If a calibration component has been connected to the tester channels 23, then the calibration component can use an identification signal-to notify the tester apparatus 20 that calibration subsequently needs to be performed. In this case, the test flow control unit 21 transfers control of the calibration operation to the calibration control unit 24.

The identification signal is generated in the calibration component by the control unit 6 and is transmitted to the tester device 20 through the signal inputs and outputs.

The calibration control unit 24 notifies the connected calibration component that calibration is subsequently being performed. Next, the calibration component applies a calibration signal to all the tester channels 23 connected to signal inputs E of the components to be tested and applies a reference clock signal to the tester channel 23 connected to the clock input CLK of the components to be tested. As described above, the connected calibration component then ascertains a phase difference information item for each of the tester channels 23 that are connected in the regular test mode to the signal input E of the component to be tested. The calibration signal is made available by the tester device for a predetermined length of time. When the phase difference measurements have been taken for each signal input E, the calibration control unit 24 receives phase difference information for each of the measured tester channels 23 via one or more of the tester channels 23. The delay devices 22 for the tester channels 23 having the signal inputs E of the component which is to be tested are set according to the phase difference information item received, so that data which are to be transmitted, which are transmitted either by the test flow control unit 21 or by the calibration control unit 24, are delayed in accordance with the delay time which has been set.

To test the tester channels 23, which in the regular test mode are connected to the signal outputs or to the bi-directional connections of the components to be tested, the reference clock signal is then connected, under the control of the control unit 6 in the calibration component, to the signal outputs A via the calibration component and is thus present on the tester channels 23. In this way, it is possible to determine the systematic time discrepancy between the signal paths on which signals are passed from the component to be tested to the tester apparatus during the subsequent component test. To this end, the calibration component is controlled such that each signal output connection A is connected to the reference clock signal CLK in succession or simultaneously. The delay devices 22 connected to the tester channels 23 which are connected to the signal outputs A of the calibration component are set on the basis of the measured systematic time discrepancy for the respective tester channels 23.

The tester apparatus 20 is controlled such that, during the calibration procedure, it applies calibration signals to the respective tester channel 23 in a first mode and receives the corresponding phase difference information about one or more of the tester channels 23 in a second mode. This is necessary since transmission of data on the tester channel 23 on which there is a calibration signal is not possible. When all the relevant delay devices 22 have been set, the calibration procedure is terminated and the next component to be tested is connected to the tester channel 23. If the tester device 20 establishes that the newly connected component is not a calibration component, then a test procedure prescribed by the test flow control apparatus 21 is carried out.

The internal configuration of the calibration component has been chosen such that no significant corruption of the signal delay times through the calibration component can arise. To this end, various trimming elements are provided and these are tuned according to the circumstances prevailing in the components to be tested, with allowance being made for internal signal path lengths. Trimming elements can be input capacitances and delay elements, for example. In this way, the response of the signal inputs and signal outputs of the calibration component is made to correspond essentially to the response of the signal inputs and signal outputs of the components to be tested.

Instead of the pin selection device 4, which respectively connects the corresponding signal input E to the phase difference unit 1 under the control of the control unit 6 in a calibration component, provision can also be made for a dedicated phase difference unit 1 to be made available for each of the signal inputs E. This allows the procedure of measuring the phase differences for the signal inputs to be made parallel and hence speeded up.

The reference clock signal can be generated by a clock generator circuit 9 integrated on the calibration component and shown by dashed lines. It is merely necessary to adjust the internally generated reference clock before measuring the phase differences for the reference clock signal with the calibration signals applied to the signal inputs E.

The invention affords a precise calibration method that is at the same time simple to incorporate in the production process and also permits older tester devices to be kept available for new product generations. The tester device is calibrated by virtue of the interaction of the calibration module with the appropriately modified tester device and with a special calibration program running on the tester device.

The features of the invention that have been disclosed in the description above, in the claims and in the drawings can be significant both individually and in any desired combination for the purpose of implementing the invention in its various embodiments.

We claim:

1. An electronic calibration component for calibrating a tester device, the electronic calibration component being a standalone component selectively connectible to the tester device and is not necessary for the functionality of the tester device, the electronic calibration component comprising:
   a signal input releasbly connected to the tester device;
   a phase difference circuit coupled to said signal input and receiving a reference clock signal to determine a phase difference information item between a cyclic calibration signal applied to the signal input and the reference clock signal; and
   an output device for outputting the phase difference information item to the tester device said output device coupled to said phase difference circuit.

2. The electronic calibration component according to claim 1, wherein said output device is configured to output the phase difference information item through said signal input.

3. The electronic calibration component according to claim 1, further comprising a reference clock signal input coupled to said phase difference circuit for receiving the reference clock signal.

4. The electronic calibration component according to claim 1, further comprising a reference clock signal generating device for generating the reference clock signal and coupled to said phase difference unit.

5. The electronic calibration component according to claim 1, further comprising a data storage device connected to said phase difference circuit, said data storage device storing the phase difference information item.

6. The electronic calibration component according to claim 1, further comprising:
   a reference clock signal input; and
   a reference clock signal switching device connected to said phase difference unit and to said reference clock signal input, said reference clock switching device couples said signal input to said reference clock signal input.

7. The electronic calibration component according to claim 1, further comprising a plurality of further signal inputs which can be connected to the tester device using a plurality of tester channels, said plurality of further signal inputs are respectively connected to said phase difference circuit.

8. The electronic calibration component according to claim 1,
   wherein maid signal input is one of a plurality of signal inputs which can be connected to the tester device using a plurality of tester channels; and
   further comprising a switching apparatus connected between said signal inputs and said phase difference circuit for coupling each of said signal inputs to said phase difference circuit for calibrating one of the plurality of tester channels.

9. The electronic calibration component according to claim 1, further comprising a housing for housing components of the electronic calibration component.

10. The electronic calibration component according to claim 1, wherein the phase difference information item contains a magnitude for a phase difference.

11. The electronic calibration component according to claim 1, wherein the phase difference information item contains an arithmetic sign for a phase difference.

12. The electronic calibration component according to claim 1, further comprising a control unit which operates the electronic calibration component in a first mode and in a second mode, the first mode having a provision for data to be received and transmitted via a tester channel of the tester device, and the second mode having provision for the phase difference circuit to be connected to said signal input in order to determine the phase difference information item.

13. A calibration method, which comprises the step of:
   providing the electronic calibration component according to claim 1;
   adding the electronic calibration component to a number of functional components to be tested; and
   calibrating a tester device while the number of functional components to be tested are being tested using the tester device.

14. In combination with the electronic calibration component according to claim 1, the tester device for performing a test procedure, the tester device comprising:
   a tester channel to which the cyclic calibration signal can be applied;
   a control device for receiving the phase difference information item from the electronic calibration component, said tester channel connected to said control device; and
   a delay device connected to said tester channel to delay signals which are to be transmitted on said tester channel on a basis of the phase difference information item.

15. The tester device according to claim 14, further comprising a further tester channel for applying a reference clock signal.

16. The tester device according to claim 15, wherein:
   said phase difference circuit is for determining a further phase difference between a signal received on said tester channel and the reference clock signal applied to said further tester channel.

17. The tester device according to claim 16, wherein said delay device is suitable for delaying a transmission of signals on one of said tester channel and said further tester channel on a basis of the further phase difference.

18. The tester device according to claim 14, wherein:
   said delay device is one of a plurality of delay devices;
   said tester channel is one of a plurality of tester channels each connected to one of said delay devices; and
   said control device is configured to receive the phase difference information item for each of said tester channels, with each of said delay devices being suitable for delaying the transmission of signals on a basis of each of the phase difference information items.

19. A method for calibrating a tester device having a tester channel for testing functional components, which comprises the steps of:
   initially connecting an electronic calibration component to the tester channel;
   making available a cyclic calibration signal on the tester channel;
   making available a reference clock signal;
   determining a phase difference information item from a phase difference between the reference clock signal and the cyclic calibration signal; and
   setting a signal delay for the tester channel such that the cyclic calibration signal is delayed on a basis of the phase difference information item.

20. The method according to claim 19, which comprises making available the reference clock signal on a further tester channel.

21. The method according to claim 20, which comprises transmitting via the tester device an identification information item via one of the tester channel and the further tester channel before a start of testing of a functional component, the calibrating being started if a response to the identification information item indicates that the electronic calibration component is connected to the tester channel.

22. The electronic calibration component according to claim 1, wherein the tester device provides the cyclic calibration signal and the reference clock signal to the electronic calibration component.

* * * * *